US012771091B2

(12) United States Patent
Matsunaga

(10) Patent No.: US 12,771,091 B2
(45) Date of Patent: Oct. 20, 2026

(54) CAP HOUSING, CAP, AND SEMICONDUCTOR DEVICE

(71) Applicant: SHINKO ELECTRIC INDUSTRIES CO., LTD., Nagano (JP)

(72) Inventor: Koki Matsunaga, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 529 days.

(21) Appl. No.: 18/466,275

(22) Filed: Sep. 13, 2023

(65) Prior Publication Data

US 2024/0113494 A1 Apr. 4, 2024

(30) Foreign Application Priority Data

Sep. 27, 2022 (JP) ................................ 2022-153938

(51) Int. Cl.
*H01S 5/02208* (2021.01)

(52) U.S. Cl.
CPC ................................ *H01S 5/02208* (2013.01)

(58) Field of Classification Search
CPC ............. H01S 5/02208; H01S 5/02257; H01S 5/02212
See application file for complete search history.

(56) References Cited

U.S. PATENT DOCUMENTS

2009/0092168 A1* 4/2009 Yamauchi .............. G11B 7/127 372/107
2009/0140416 A1* 6/2009 Ishida ................. H01S 5/02212 257/E23.181
2018/0175584 A1* 6/2018 Nakazawa .......... H01S 5/02212

FOREIGN PATENT DOCUMENTS

JP S58-056482 4/1983
JP H02-297988 12/1990
JP 2004-170214 6/2004

OTHER PUBLICATIONS

Office Action mailed on Apr. 28, 2026 with respect to the corresponding Japanese patent application No. 2022-153938.

* cited by examiner

*Primary Examiner* — Yuanda Zhang
(74) *Attorney, Agent, or Firm* — IPUSA, PLLC

(57) ABSTRACT

A cap housing includes a tubular part, and a top plate, extending from one end toward a center axis of the tubular part, and having an opening. The top plate includes an annular first surface facing the opening, an annular second surface continuous with the first surface and perpendicular to the center axis, and an annular third surface continuous with the second surface and inclined from the second surface. The third surface is inclined from the second surface so as to separate farther away from a center of the tubular part in a direction along the center axis as the third surface approaches the tubular part. A second size of the second surface on a straight line perpendicular to the center axis and passing through the center axis is smaller than or equal to a first size of the first surface in a direction along the center axis.

11 Claims, 5 Drawing Sheets

CAP HOUSING, CAP, AND SEMICONDUCTOR DEVICE

CROSS-REFERENCE TO RELATED APPLICATIONS

This application is based upon and claims priority to Japanese Patent Application No. 2022-153938, filed on Sep. 27, 2022, the entire contents of which are incorporated herein by reference.

FIELD

Certain aspects of the embodiments discussed herein are related to cap housings, caps, and semiconductor devices.

BACKGROUND

Conventionally, there is a known semiconductor device having a light emitting element mounted on a header in a state hermetically sealed by a cap. In the cap of such a semiconductor device, an opening is provided at a center of a top plate of a cap housing that is also referred to as an eyelet, and a transparent member is bonded to an inner surface of the top plate using an adhesive so as to close the opening. Such a semiconductor device is proposed in Japanese Laid-Open Patent Publication No. S58-056482 and Japanese Laid-Open Patent Publication No. 2004-170214, for example.

In the conventional cap, an effective diameter of the opening part may decrease due to a flow of the adhesive, or a sufficient adhesive strength may not be obtained between the top plate and the transparent member.

SUMMARY

Accordingly, it is an object in one aspect of the embodiments of the present disclosure to provide a cap housing, a cap, and a semiconductor device capable of minimizing a decrease in an effective diameter of an opening, while obtaining a sufficient adhesive strength between a top plate and a transparent member.

According to one aspect of the embodiments of the present disclosure, there is provided a cap housing including a tubular part; and a top plate, extending from one end of the tubular part toward a center axis of the tubular part, and having an opening, wherein the top plate includes an annular first surface facing the opening, an annular second surface continuous with the first surface and perpendicular to the center axis, and an annular third surface continuous with the second surface and inclined from the second surface, the third surface is inclined from the second surface so as to separate farther away from a center of the tubular part in a direction along the center axis as the third surface approaches the tubular part, and a second size of the second surface on a straight line perpendicular to the center axis and passing through the center axis is smaller than or equal to a first size of the first surface in a direction along the center axis.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
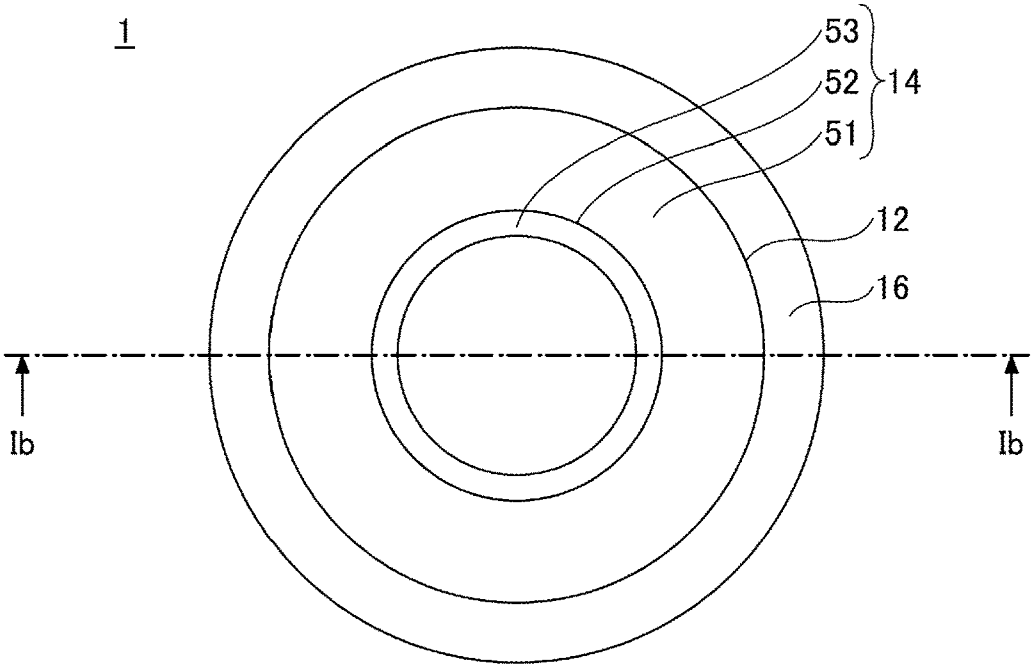
FIG. 1A and FIG. 1B are diagrams illustrating a cap housing according to a first embodiment.

Preferred embodiments of the present invention will be described with reference to the accompanying drawings. In the drawings, those parts that are the same are designated by the same reference numerals, and a repeated description of the same parts may be omitted.

First Embodiment

Figure 1B:
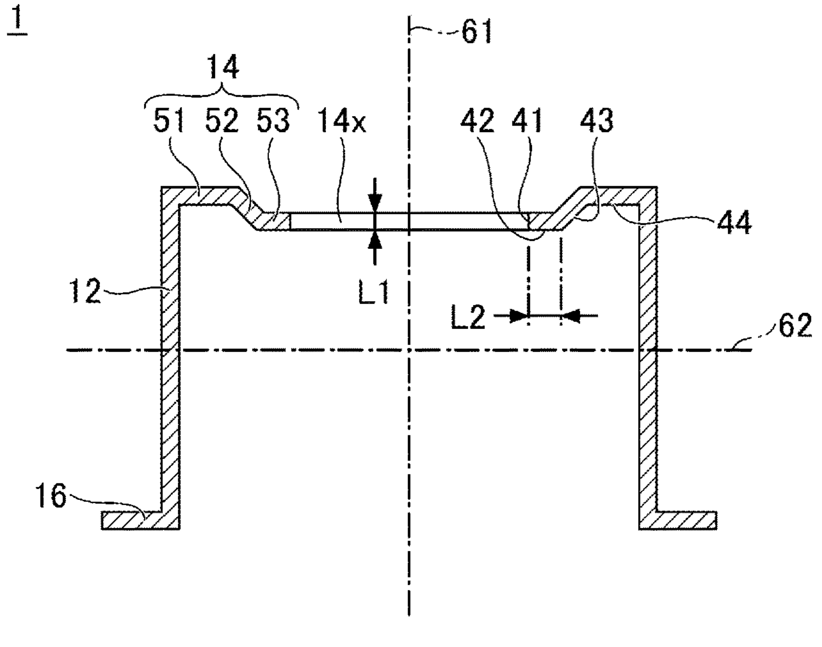

A first embodiment will be described. The first embodiment relates to a cap housing. FIG. 1A and FIG. 1B are diagrams illustrating the cap housing according to the first embodiment. FIG. 1A is a plan view of the cap housing, and FIG. 1B is a cross sectional view of the cap housing. FIG. 1B corresponds to a cross sectional view taken along a line Ib-Ib in FIG. 1A.

As illustrated in FIG. 1A and FIG. 1B, a cap housing 1 according to the first embodiment is bell-shaped, and includes a tubular part 12, a top plate 14, and a flange 16. The tubular part 12 has a hollow cylindrical shape, for example. The top plate 14 is a plate member extending from one end (upper end) of the tubular part 12 toward a center axis 61 of the tubular part 12 in the plan view. The plan view refers to a view of an object in a direction of FIG. 1A. The flange 16 is a plate member that annularly protrudes outward from the other end (lower end) of the tubular part 12 in the plan view. The top plate 14 and the flange 16 are disposed approximately parallel to each other, for example.

The tubular part 12, the top plate 14, and the flange 16 are integrally formed by performing a mechanical working on an iron-based (Fe-based) metal plate, for example. A 42-alloy (iron-nickel (Fe—Ni) alloy), Kovar (registered trademark, iron-nickel-cobalt (Fe—Ni—Co) alloy), or the like can be preferably used as the iron-based (Fe-based) metal. Surfaces of the tubular part 12, the top plate 14, and the flange 16 may be plated. Thicknesses of the tubular part 12, the top plate 14, and the flange 16 are approximately constant, and are in a range of approximately 0.1 mm to approximately 0.3 mm, for example.

The top plate 14 includes a base 51, a connecting part 52, and a support 53. The top plate 14 includes an opening 14$x$ at a center portion thereof. A planar shape of the opening 14$x$ is a circular shape, for example.

The base 51 extends from the one end (upper end) of the tubular part 12 toward the center axis 61 in the plan view. The base 51 has an annular shape. The base 51 is approximately perpendicular to the center axis 61.

The connecting part 52 extends from an inner end portion of the base 51 toward the center axis 61 in the plan view. The connecting part 52 has an annular shape. The connecting part 52 is inclined with respect to the center axis 61. The connecting part 52 connects the base 51 and the support 53.

The support 53 extends from an inner end portion of the connecting part 52 toward the center axis 61 in the plan view. The support 53 has an annular shape. The support 53 is approximately perpendicular to the center axis 61. The opening 14*x* is formed in the support 53. As will be described later, the support 53 supports a transparent member 20 illustrated in FIG. 2A and FIG. 2B, and the transparent member 20 is bonded to the top plate 14 by an adhesive 30 illustrated in FIG. 2B.

The top plate 14 has an inner surface and an outer surface. The inner surface of the top plate 14 is a surface of the top plate 14 that is exposed to the inside of the tubular part 12, and the outer surface of the top plate 14 is a surface opposite to the inner surface of the top plate 14. The inner surface of the top plate 14 includes a second surface 42, a third surface 43, and a fourth surface 44.

The support 53 has an annular first surface 41 facing (or defining) the opening 14*x*, and the annular second surface 42 connected to the first surface 41 and perpendicular to the center axis 61. The second surface 42 faces a space inside the tubular part 12. The connecting part 52 has the annular third surface 43 that is continuous with the second surface 42 and is inclined from the second surface 42. The third surface 43 is inclined from the second surface 42 so as to separate farther away from a center 62 of the tubular part 12 in a direction (axial direction) along the center axis 61 as the third surface 43 approaches the tubular part 12, that is, at a portion of the third surface 43 located more toward an outer side thereof. The third surface 43 faces the space inside the tubular part 12. The base 51 has the annular fourth surface 44 continuous with both the third surface 43 and the tubular part 12. The fourth surface 44 is perpendicular to the center axis 61, for example. The fourth surface 44 faces the space inside the tubular part 12.

Accordingly, at the top plate 14, there is a step (that is, a ramp or height difference) between the base 51 and the support 53.

A second size L2 of the second surface 42 along a straight line perpendicular to the center axis 61 and passing through the center axis 61, is smaller than or equal to a first size L1 of the first surface 41 in a direction (axial direction) along the center axis 61. The first size L1 corresponds to a thickness of the top plate 14. On the other hand, the second size L2 corresponds to the size of the second surface 42 in a radial direction in a cross section passing through the center axis 61.

The cap housing 1 can be manufactured by pressing or the like of a flat metal plate, for example. The opening 14*x* may be formed by punching or the like after forming the top plate 14 to include the base 51, the connecting part 52, and the support 53, for example. The surfaces of the cap housing 1, including an inner wall (first surface 41) of the opening 14*x*, may be plated, as appropriate. A noble metal may be suitably used for the plating, for example.

Although a detailed description will be given later, it is possible to minimize a decrease in an effective diameter of the opening 14*x*, while obtaining a sufficient adhesive strength between the top plate 14 and the transparent member 20, by configuring a cap using the cap housing 1 according to the first embodiment.

Second Embodiment

Figure 2A:
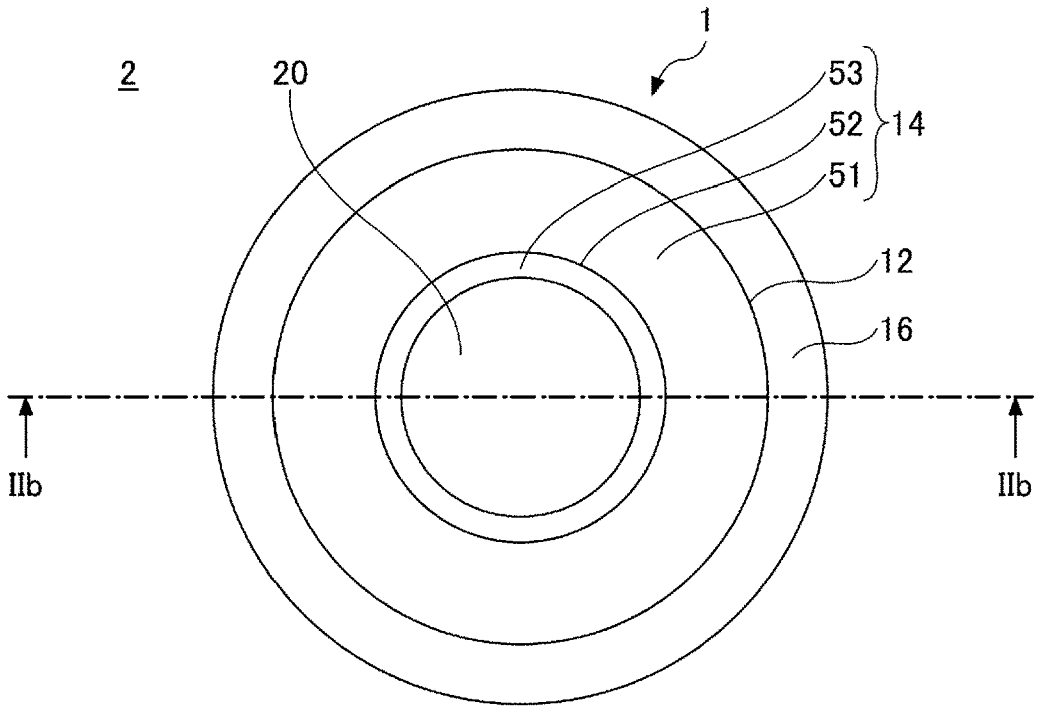
FIG. 2A and FIG. 2B are diagrams illustrating a cap according to a second embodiment.
Figure 2B:
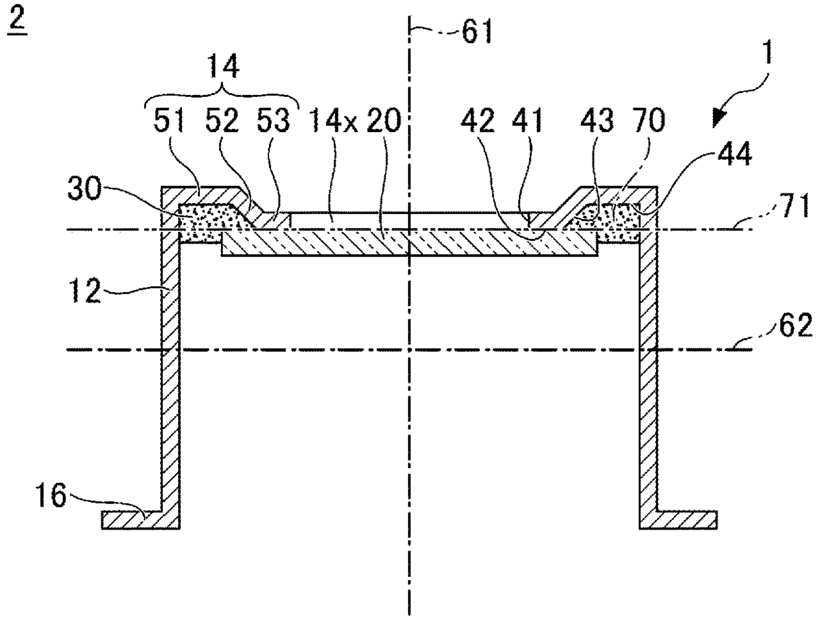

A second embodiment will be described. The second embodiment relates to the cap including the cap housing 1 according to the first embodiment. FIG. 2A and FIG. 2B are diagrams illustrating the cap according to the second embodiment. FIG. 2A is a plan view of the cap, and FIG. 2B is a cross sectional view of the cap. FIG. 2B corresponds to a cross sectional view taken along a line IIb-IIb in FIG. 2A.

As illustrated in FIG. 2A and FIG. 2B, a cap 2 according to the second embodiment includes the cap housing 1, the transparent member 20, and the adhesive 30.

The transparent member 20 is a plate member capable of transmitting light in a predetermined wavelength range. For example, an antireflection coating may be provided on a surface of the transparent member 20. The transparent member 20 is disposed inside the cap housing 1. More particularly, the transparent member 20 is bonded to the inner surface of the top plate 14 using the adhesive 30, so as to close the opening 14*x*. The opening 14*x* of the top plate 14 is hermetically sealed by being sealed by the transparent member 20. A material used for the transparent member 20 may be glass, for example. For example, the transparent member 20 is made of a first glass.

The transparent member 20 has a regular hexagonal shape in the plan view, for example, but the planar shape of the transparent member 20 is not limited thereto, and the transparent member 20 may have various planar shapes, such as a circular shape or the like. However, because the regular hexagonal shape is easy to form by cutting a large glass substrate into individual transparent members 20, from this viewpoint, the transparent member 20 preferably has the regular hexagonal shape in the plan view. The transparent member 20 has an approximately constant thickness in a range of approximately 0.15 mm to approximately 1.20 mm, for example. At least a portion of a side surface of the transparent member 20 is separated from the tubular part 12. The entire side surface of the transparent member 20 may be separated from the tubular part 12.

A portion of the upper surface of the transparent member 20 is in contact with the second surface 42. Another portion of the upper surface of the transparent member 20 is located on the inner side the second surface 42 in the plan view, and is exposed via the opening 14*x*. Still another portion of the upper surface of the transparent member 20 is located on the outer side the second surface 42 in the plan view, faces at least the third surface 43, and may further face the fourth surface 44.

The adhesive 30 is annularly disposed between the upper surface of the transparent member 20 and each of the third surface 43 and the fourth surface 44. The adhesive 30 is in contact with the third surface 43, the fourth surface 44, and the upper surface of the transparent member 20. The adhesive 30 may further be in contact with the inner wall surface of the tubular part 12. In addition, the adhesive 30 may further be in contact with a side surface of the transparent member 20. A material used for the adhesive 30 may be a bismuth-based low melting glass or the like, for example. The low melting glass has a melting point lower than a melting point of the glass forming the transparent member 20. For example, the adhesive 30 is made of a second glass having a melting point lower than a melting point of the first glass.

Figure 3:
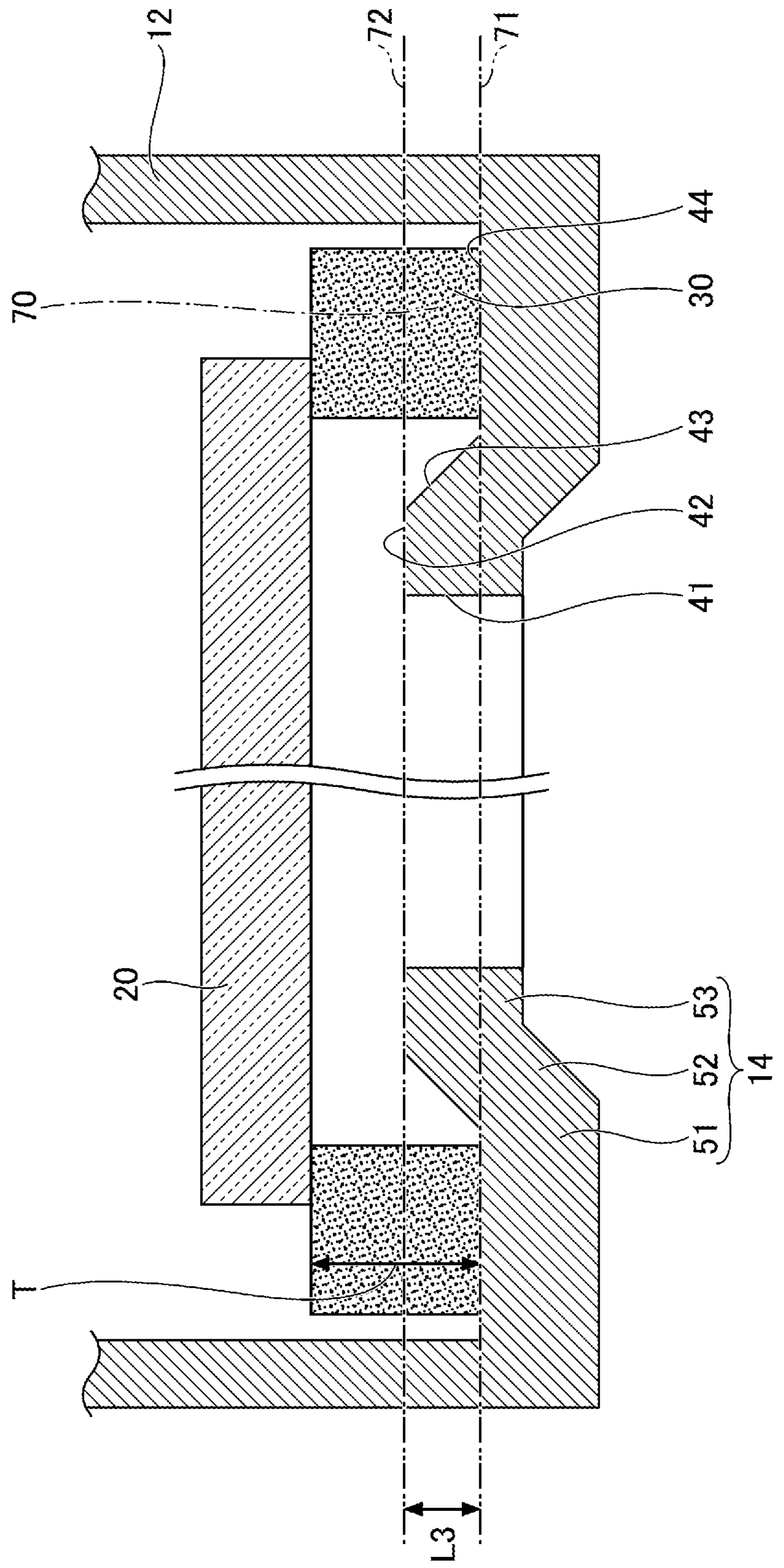
FIG. 3 is a cross sectional view illustrating a method for manufacturing the cap according to a second embodiment.

Next, a method for manufacturing the cap 2 will be described. FIG. 3 is a cross sectional view illustrating a method for manufacturing the cap according to the second embodiment.

First, the cap housing 1 is prepared. Next, as illustrated in FIG. 3, the cap housing 1 is arranged upside down from the state illustrated in FIG. 2B, and the adhesive 30 is disposed on the fourth surface 44 of the top plate 14 of the cap housing 1. A low melting glass is used for the adhesive 30, for example. The adhesive 30 is formed by compression molding a low melting glass powder into a single-hole doughnut shape (annular shape). Then, the transparent member 20 is disposed on the adhesive 30. An outer peripheral portion of the transparent member 20 is in contact with the adhesive 30. In this state, the cap housing 1, the transparent member 20, and the adhesive 30 are placed in a melting furnace, and subjected to a heat treatment at a temperature of approximately 500° C.

The adhesive 30 is melted by the heat treatment, and the adhesive 30 wets and spreads due to a weight of the transparent member 20. In addition, the adhesive 30 solidifies during a cooling process after the heat treatment. As a result, the transparent member 20 is bonded to the top plate 14. In the case where the transparent member 20 is made of the first glass and the adhesive 30 is made of the low melting glass (second glass), the melting point of the low melting glass is lower than the melting point of the first glass. For example, the melting point of the low melting glass is approximately 500° C., and the melting point of the first glass is approximately 730° C. By using the low melting glass for the adhesive 30, the transparent member 20 made of the first glass can be hermetically bonded to the top plate 14 of the cap housing 1.

When the adhesive 30 melts, the transparent member 20 moves downward due to gravity and comes into contact with the second surface 42. For this reason, the melted adhesive 30 is prevented from flowing into the opening 14*x*. The melted adhesive 30 may flow into a gap between the side surface of the transparent member 20 and the tubular part 12.

Because the second size L2 is smaller than or equal to the first size L1, a portion of the top plate 14 located closer to the center axis 61 than the adhesive 30 has a narrow width. In a case where the shape and the size of the adhesive 30 are constant, the narrower the width of the portion of the top plate 14 located closer to the center axis 61 than the adhesive 30 is, the larger an opening area of the opening 14*x* becomes.

As described above, because the flow of the melted adhesive 30 into the opening 14*x* is prevented, and the second size L2 is smaller than or equal to the first size L1, the present embodiment can minimize the decrease in the effective diameter of the opening 14*x* and obtain a large effective diameter.

In addition, in the case where the shape and size of the opening 14*x* are constant, the smaller the second size L2 is, the larger a contact area of the adhesive 30 with the top plate 14 and the transparent member 20 becomes, thereby enabling a more excellent adhesive strength to be obtained.

Moreover, the third surface 43 of the cap housing 1 is inclined so as to separate more from the center 62 of the tubular part 12 in the direction (axial direction) along the center axis 61 as the third surface 43 approaches the tubular part 12, that is, at a portion of the third surface 43 located more on the outer side. That is, a distance between the third surface 43 and the surface of the transparent member 20 (the lower surface of the transparent member 20 in a vertical direction) in contact with the second surface 42 decreases toward the center axis 61. Accordingly, the melted adhesive 30 easily wets and spreads between the third surface 43 and the lower surface of the transparent member 20 due to capillarity. For this reason, an excellent adhesive strength can be obtained between the top plate 14 and the transparent member 20.

The second size L2 is preferably larger than or equal to ½ times the first size L1. This is because, if the second size L2 were smaller than ½ times the first size L1, the area of the second surface 42 would become small, and it may become difficult to stabilize an orientation of the transparent member 20 when the adhesive 30 is melted during the manufacturing process of the cap 2.

A volume of an annular region 70 surrounded by a plane 71 including the second surface 42, the top plate 14, and the tubular part 12 is preferably smaller than a volume of the adhesive 30. This is to ensure filling the region 70 with the adhesive 30. In addition, a distance L3 between the plane 71 including the second surface 42, and a plane 72 including the fourth surface 44, is preferably less than or equal to ½ times a height T of the adhesive 30 used for manufacturing the cap 2 before being melted. This is because, if the distance L3 were greater than ½ times the thickness T, it may become difficult to fill the region 70 with the adhesive 30 depending on the width of the adhesive 30 in the plan view.

Figure 4A:
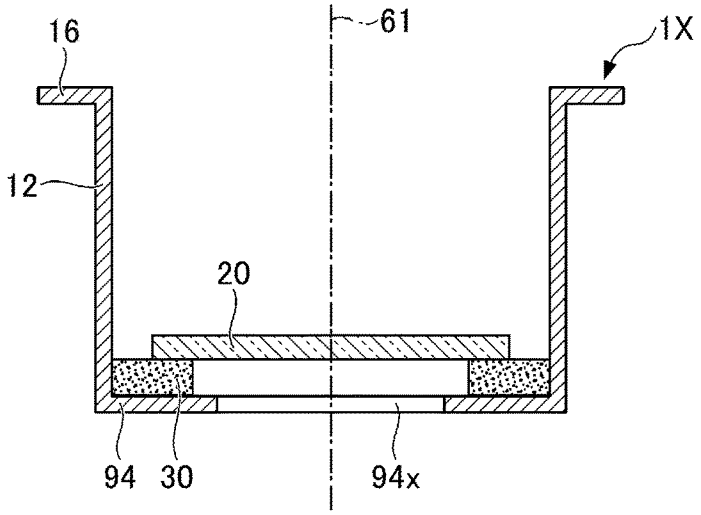
FIG. 4A, FIG. 4B, and FIG. 4C are diagrams illustrating a method for manufacturing a cap according to a comparative example.
Figure 4B:
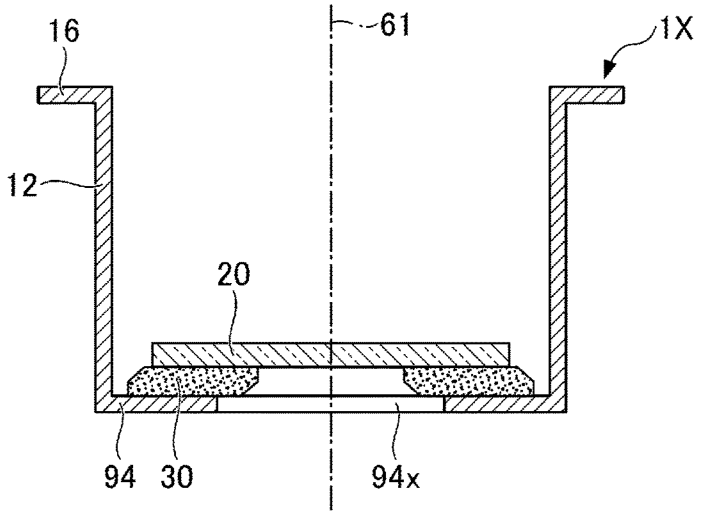
Figure 4C:
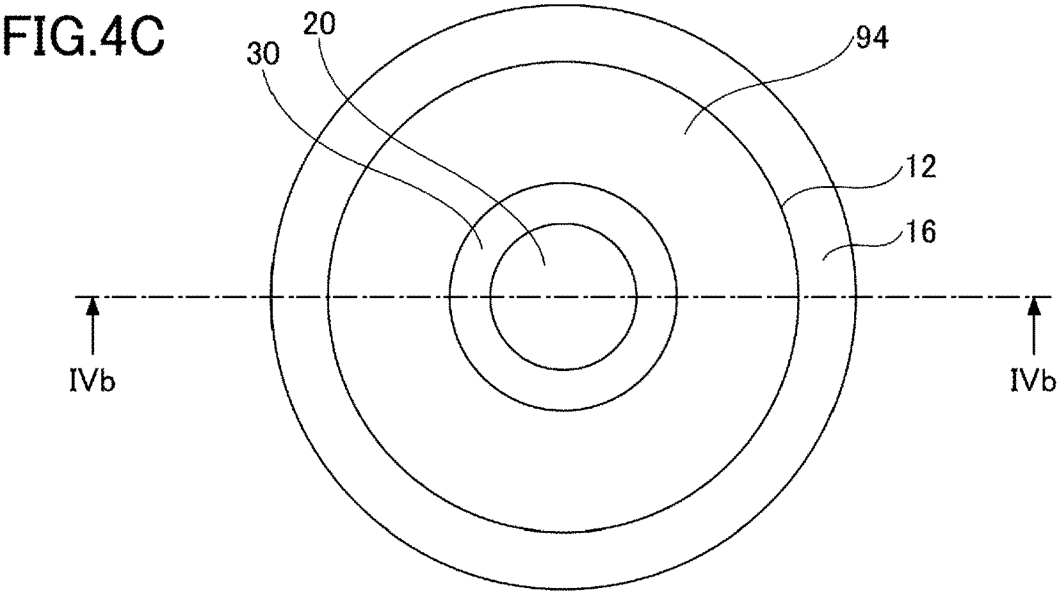

Next, a comparative example will be described for comparison with the second embodiment. FIG. 4A, FIG. 4B, and FIG. 4C are diagrams illustrating a method for manufacturing a cap according to the comparative example. FIG. 4A and FIG. 4B are cross sectional views of the cap, and FIG. 4C is a bottom view of the cap. FIG. 4B corresponds to a cross sectional view taken along a line IVb-IVb in FIG. 4C.

In the method for manufacturing a cap 2X according to the comparative example, a cap housing 1X different from the cap housing 1 is used, as illustrated in FIG. 4A. The cap housing 1X includes the tubular part 12, a top plate 94, and the flange 16.

Configurations of the tubular part 12 and the flange 16 of the cap housing 1X are the same as the configurations of the tubular part 12 and the flange 16 of the cap housing 1.

The top plate 94 is a flat plate member extending from the one end (upper end) of the tubular part 12 toward the center axis 61 of the tubular part 12 in the plan view. The top plate 94 has an annular shape. The top plate 94 is approximately perpendicular to the center axis 61. The top plate 94 includes an opening 94*x* at a center portion thereof. A configuration of the opening 94*x* is the same as the configuration of the opening 14*x*. The top plate 94 does not have a step (that is, a ramp or height difference) that exists in the top plate 14.

In the method for manufacturing the cap 2X, the cap housing 1X is prepared, and the adhesive 30 similar to that of the second embodiment is disposed on an inner surface of the top plate 94 of the cap housing 1X. Next, the transparent member 20 is disposed on the adhesive 30. In this state, the cap housing 1X, the transparent member 20, and the adhesive 30 are placed in a melting furnace, and subjected to a heat treatment at a temperature of approximately 500° C.

The adhesive 30 is melted by the heat treatment, and the adhesive 30 wets and spreads by the weight of the transparent member 20. In addition, the adhesive 30 solidifies during a cooling process after the heat treatment. As a result, as illustrated in FIG. 4B and FIG. 4C, the transparent member 20 is bonded to the top plate 94.

However, when the adhesive 30 melts, the transparent member 20 does not make contact with the inner surface of the top plate 94, and a portion of the melted adhesive 30 flows into the opening 94*x*. For this reason, in the cap 2X, a portion of the adhesive 30 exists inside the opening 94*x* after the adhesive 30 is solidified. Accordingly, an effective diameter of the cap 2X becomes smaller than the effective diameter of the cap 2. In other words, the cap 2 has an effective diameter larger than the effective diameter of the cap 2X.

Third Embodiment

Figure 5A:
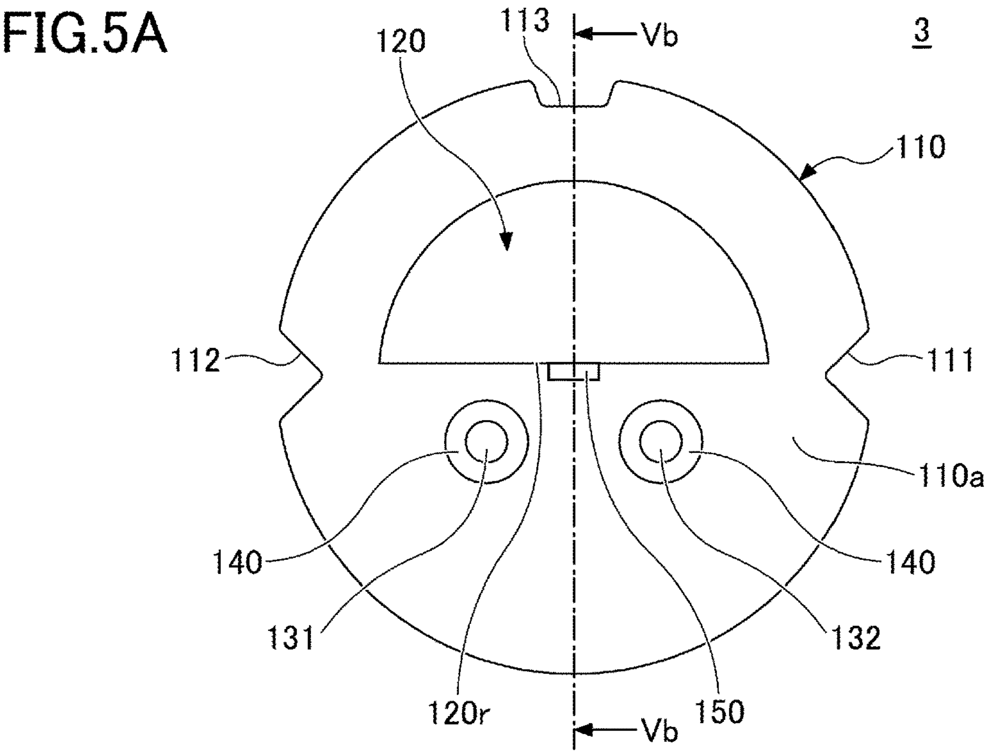
FIG. 5A and FIG. 5B are diagrams illustrating a semiconductor device according to a third embodiment.
Figure 5B:
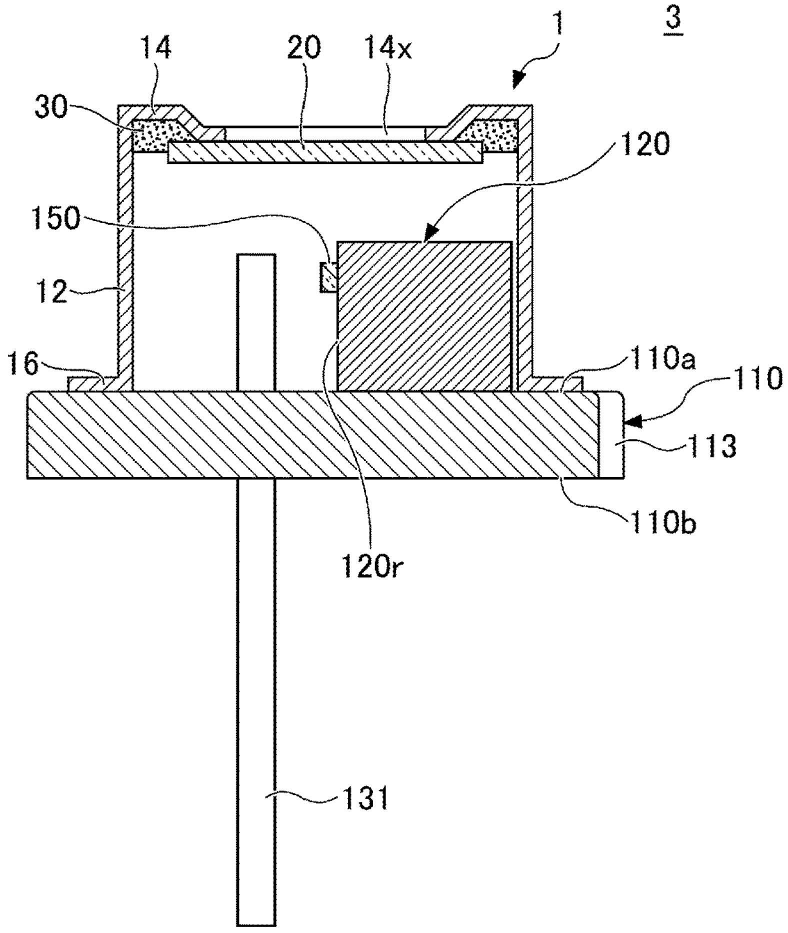

A third embodiment will be described. The third embodiment relates to a semiconductor device including the cap according to the second embodiment. FIG. 5A and FIG. 5B are diagrams illustrating the semiconductor device according to the third embodiment. FIG. 5A is a plan view of the semiconductor device, and FIG. 5B is a cross sectional view of the semiconductor device. FIG. 5B corresponds to a cross sectional view taken along a line Vb-Vb in FIG. 5A. In FIG. 5A, illustration of the cap 2 is omitted.

As illustrated in FIG. 5A and FIG. 5B, a semiconductor device 3 according to the third embodiment includes the cap 2, an eyelet 110, a metallic block 120, a first lead 131, a second lead 132, a sealing portion 140, and a light emitting element 150. The eyelet 110, the metallic block 120, the first lead 131, the second lead 132, and the sealing portion 140 may be collectively referred to as a header. The header may sometimes also be referred to as a stem.

The eyelet 110 is a disk-shaped member. A diameter of the eyelet 110 is not particularly limited, and may be suitably determined depending on an intended purpose or use. The diameter of the eyelet 110 is 5.6 mm, 9.0 mm, or the like, for example. A thickness of the eyelet 110 is not particularly limited, and may be suitably determined depending on the intended purpose or use. The thickness of the eyelet 110 is in a range of approximately 0.5 mm to approximately 3 mm, for example. The eyelet 110 can be formed of a metal material, such as iron, stainless steel, or the like, for example. A surface of the eyelet 110 may be plated.

Cutouts 111, 112, and 113 having a shape recessed from an outer periphery toward a center of the eyelet 10 in the plan view, are formed in an outer edge portion of the eyelet 110. The cutouts 111, 112, and 113 are recesses having a planar shape that is an approximately triangular or approximately rectangular, for example. The cutouts 111, 112, and 113 can be used for positioning or alignment when mounting the light emitting element 150, for example.

The metallic block 120 is bonded to an upper surface 110*a* of the eyelet 110 using a brazing material or the like, and protrudes from the upper surface 110*a* of the eyelet 110. The metallic block 120 includes an element mounting surface 120*r* on which the light emitting element 150 is mounted. The element mounting surface 120*r* is provided so as to be approximately perpendicular to the upper surface 110*a* of the eyelet 110.

A distance between an upper surface of the metallic block 120 and the upper surface 110*a* of the eyelet 110 (a protruding amount of the metallic block 120 from the upper surface 110*a* of the eyelet 110) is in a range of approximately 2 mm to approximately 3 mm, for example. The metallic block 120 may be made of a material having a thermal conductivity higher than a thermal conductivity of the eyelet 110. In a case where the material used for the eyelet 110 is iron, the material used for the metallic block 120 is copper, for example.

The first lead 131 and the second lead 132 are inserted into through holes penetrating the eyelet 110 in a thickness direction thereof, respectively, so that longitudinal directions of the first lead 131 and the second lead 132 are oriented in the thickness direction. In the through holes of the eyelet 110, peripheries of the first lead 131 and the second lead 132 are sealed by the sealing portion 140. First portions of the first lead 131 and the second lead 132 protrude from the upper surface 110*a* of the eyelet 110, and second portions of the first lead 131 and the second lead 132 protrude from a lower surface 110*b* of the eyelet 110. The first lead 131 and the second lead 132 are formed of a metal, such as a 50% iron-nickel alloy, Kovar (registered trademark), or the like, for example, and the sealing portion 140 is formed of an insulating material, such as a glass material or the like, for example. The number of leads may be increased in accordance with specifications of the light emitting element 150 that is to be mounted.

The light emitting element 150 is a semiconductor laser chip configured to emit light having a wavelength of one of 405 nm, 650 nm, and 780 nm, for example. The light emitting element 150 is mounted on the element mounting surface 120*r* of the metallic block 120, so that one end surface thereof faces upward (toward the transparent member 20), and the other end surface thereof faces downward (toward the upper surface 110*a* of the eyelet 110). In the semiconductor device 3, the light emitting element 150 is mounted so that a position of a light emission point of the light emitting element 150 approximately coincides with a center of the upper surface 110*a* of the eyelet 110 in the plan view. Electrodes (not illustrated) of the light emitting element 150 are connected to the first lead 131 and the second lead 132 by bonding wires or the like, for example.

For example, the flange 16 of the cap 2 is bonded to a vicinity of the outer edge portion of the upper surface 110*a* of the eyelet 110 by welding or the like. When the cap 2 is fixed to the header in this manner, the light emitting element 150 is hermetically sealed by the cap 2. Light (for example, laser light) emitted from one end surface of the light emitting element 150 passes through the transparent member 20 located at the opening 14*x* of the top plate 14, and is emitted to the outside of the semiconductor device 3. The light emitted from the other end surface of the light emitting element 150 may be received by a photodiode or the like, so as to monitor an amount of light emitted from the light emitting element 150. A circuit disposed outside the semiconductor device 3 may be configured to perform a control, so that the amount of light received by the photodiode becomes constant. In this case, the amount of light emitted from the semiconductor device 3 can be made constant regardless of an environmental temperature or the like.

As described above, the light emitting element 150 is mounted on the element mounting surface 120*r* of the semiconductor device 3, and hermetically sealed by the cap 2, thereby forming the semiconductor device 3. Further, because the cap 2 is used, a large effective diameter of the opening 14*x* can be obtained for the light emitted from the light emitting element 150. Further, an excellent adhesive strength can be obtained between the top plate 14 and the transparent member 20, and the semiconductor device 3 having a high reliability can be obtained.

According to the present disclosure, it is possible to provide a cap housing, a cap, and a semiconductor device capable of minimizing a decrease in an effective diameter of an opening, while obtaining a sufficient adhesive strength between a top plate and a transparent member.

Although the embodiments are numbered with, for example, "first," "second," or "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A cap housing comprising:

a tubular part; and a top plate, extending from one end of the tubular part toward a center axis of the tubular part, and having an opening, wherein the top plate includes an annular first surface facing the opening, an annular second surface continuous with the first surface and perpendicular to the center axis, and an annular third surface continuous with the second surface and inclined from the second surface, the third surface is inclined from the second surface so as to separate farther away from a center of the tubular part in a direction along the center axis as the third surface approaches the tubular part, and a second size of the second surface on a straight line perpendicular to the center axis and passing through the center axis is smaller than or equal to a first size of the first surface in a direction along the center axis.

2. The cap housing as claimed in claim 1, wherein the second size is larger than or equal to ½ times the first size.

3. The cap housing as claimed in claim 1, wherein the top plate has an annular fourth surface continuous with the third surface and the tubular part.

4. A cap comprising:

the cap housing according to claim 1; and a transparent member bonded to an inner surface of the top plate via an adhesive so as to close the opening.

5. The cap as claimed in claim 4, wherein the transparent member is made of a first glass, and the adhesive is made of a second glass having a melting point lower than a melting point of the first glass.

6. The cap as claimed in claim 4, wherein a volume of an annular region surrounded by a plane including the second surface, the top plate, and the tubular part is smaller than a volume of the adhesive.

7. The cap as claimed in claim 4, wherein at least a portion of a side surface of the transparent member is separated from the tubular part.

8. A semiconductor device comprising:

the cap according to claim 4; and a semiconductor device mounted on an element mounting surface of a header, wherein the cap is fixed to the header, and the semiconductor device is hermetically sealed by the cap.

9. The cap as claimed in claim 1, wherein:

the top plate includes a base, a connecting part, and a support, the base has an annular shape extending in a direction perpendicular to the center axis from an upper end of the tubular part toward the center axis in a plan view, the connecting part has an annular shape extending from an inner end portion of the base toward the center axis in the plan view, the connecting part is inclined with respect to the center axis, the support has an annular shape extending in the direction perpendicular to the center axis from an inner end portion of the connecting part toward the center axis in the plan view, and an open end of the support forms the first surface facing the opening.

10. The cap as claimed in claim 4, wherein the adhesive makes contact with an upper surface of the transparent member and only a portion of a side surface of the transparent member such that the adhesive does not reach a lower surface of the transparent member.

11. The cap as claimed in claim 10, wherein the upper surface of the transparent member makes contact with a lower surface of the support.

* * * * *